United States Patent
Kurihara et al.

(10) Patent No.: US 6,327,194 B1
(45) Date of Patent: Dec. 4, 2001

(54) PRECISE REFERENCE WORDLINE LOADING COMPENSATION FOR A HIGH DENSITY FLASH MEMORY DEVICE

(75) Inventors: Kazuhiro Kurihara, Sunnyvale; Tien-Min Chen, San Jose, both of CA (US)

(73) Assignees: Advanced Micro Devices, Inc., Sunnyvale, CA (US); Fujitsu Limited, Kanagawa (JP)

(*) Notice: Subject to any disclaimer, the term of this patent is extended or adjusted under 35 U.S.C. 154(b) by 0 days.

(21) Appl. No.: 09/644,358

(22) Filed: Aug. 23, 2000

Related U.S. Application Data
(60) Provisional application No. 60/199,471, filed on Apr. 25, 2000.

(51) Int. Cl.[7] .................................................. G11C 7/00
(52) U.S. Cl. ................................... 365/189.09; 365/226
(58) Field of Search ............................... 365/189.09, 226

(56) References Cited

U.S. PATENT DOCUMENTS

| | | | |
|---|---|---|---|
| 5,263,000 | 11/1993 | Van Buskirk et al. | 365/226 |
| 5,291,446 | 3/1994 | Van Buskirk et al. | 365/189.09 |
| 5,612,921 | 3/1997 | Chang et al. | 365/226 |
| 5,673,232 * | 9/1997 | Furutani | 365/226 |
| 5,708,387 | 1/1998 | Cleveland et al. | 327/536 |

OTHER PUBLICATIONS

AMD Datasheet for Am29LV640D/Am29LV641D, (first published May 4, 1999—see revision history on last page).

AMD Press Release #9965—"AMD Announces Industry's First 3.0–Volt, 64–Megabit Nor Flash Memory Device", p. 1 of 1, Apr. 26, 1999 ©1999 Advanced Micro Devices, Inc.

\* cited by examiner

*Primary Examiner*—David Nelms
*Assistant Examiner*—M. Tran

(57) ABSTRACT

An equalization circuit for the power distribution paths of a high density flash memory device is disclosed. The equalization circuit matches the electrical characteristics of the reference path power distribution to those of the power distribution of the memory array wordlines so as to equalize the resistance and parasitic capacitance to the sense amplifiers.

19 Claims, 18 Drawing Sheets

PRECISE REFERENCE WORDLINE LOADING COMPENSATION FOR A HIGH DENSITY FLASH MEMORY DEVICE

REFERENCE TO EARLIER FILED APPLICATION

This application claims the benefit of the filing date pursuant to 35 U.S.C. §119(e) of Provisional Application Serial No. 60/199,471, filed Apr. 25, 2000, the disclosure of which is hereby incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals two or four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

Another problem with existing flash memory devices has been the low density of storage offered as compared with traditional dynamic random access memory ("DRAM"). With the ever increasing need for storage space in modern electronic devices combined with the need to reduce the number of discrete components, there has been a corresponding pressure to increase the amount of storage available on a single flash memory device. This increase in storage density must not come at the expense of reliability.

One way to increase the storage capacity of a flash memory device is to use a core cell with a dual-level floating gate structure. Such a structure allows one core cell to represent more than one bit of information without increasing the size/area of the device. However, such dual-level core cells are difficult to design and implement because they require complex programming, erase and read logic. This is because the multiple voltage levels that can be stored in the cell now represent more than one logical value and the programming, erase and read logic must now be able to discriminate among these voltage levels. This raises concerns with the ability of the flash memory device to reliably store and retrieve data.

SUMMARY

The present invention is defined by the following claims, and nothing in this section should be taken as a limitation on those claims. By way of introduction, the preferred embodiments described below relate to a power distribution equalizer for a high density flash memory device. The device includes a core array of single level flash memory cells, a wordline voltage distribution path coupled with the core array, a reference array and a reference voltage distribution path coupled with the reference array. The reference voltage distribution path and the wordline voltage distribution path are each characterized by first and second electrical properties. The equalizer comprises a path length equalization circuit coupled with the reference voltage distribution path which is operative to equalize the first electrical property of the reference voltage distribution path to the first electrical property of the wordline voltage distribution path. The equalizer further includes a loading equalization circuit coupled with the reference voltage distribution path which is operative to equalize the second electrical property of the reference voltage distribution path to the second electrical property of the wordline voltage distribution path.

The preferred embodiments further relate to a method of equalizing the wordline voltage and current distributed to a core cell over a wordline distribution path to the voltage and current distributed to a reference cell over a reference distribution path in a high density flash memory device. The method comprises: determining a loading comprising capacitance and resistance of the wordline distribution path; determining a loading comprising capacitance and resistance of the reference distribution path; equalizing the loading of the reference distribution path to the loading of the wordline distribution path.

DETAILED DESCRIPTION OF THE PRESENTLY PREFERRED EMBODIMENTS

Herein, the phrase "coupled with" is defined to mean directly connected to or indirectly connected with through one or more intermediate components. Further, as used herein, the phrase "high logic level" is used to indicate a logic level of 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low") and some signals are asserted when they are at a high logic level (also referred to as "active high"). It will be appreciated that all forms of digital logic representation are contemplated including mixed logic. It will further be appreciated that the underlying voltages of the logic signals may also vary, with typical values being 2 or 3 Volts representing a logic 1 and 0 Volts representing logic 0.

Figure 1:
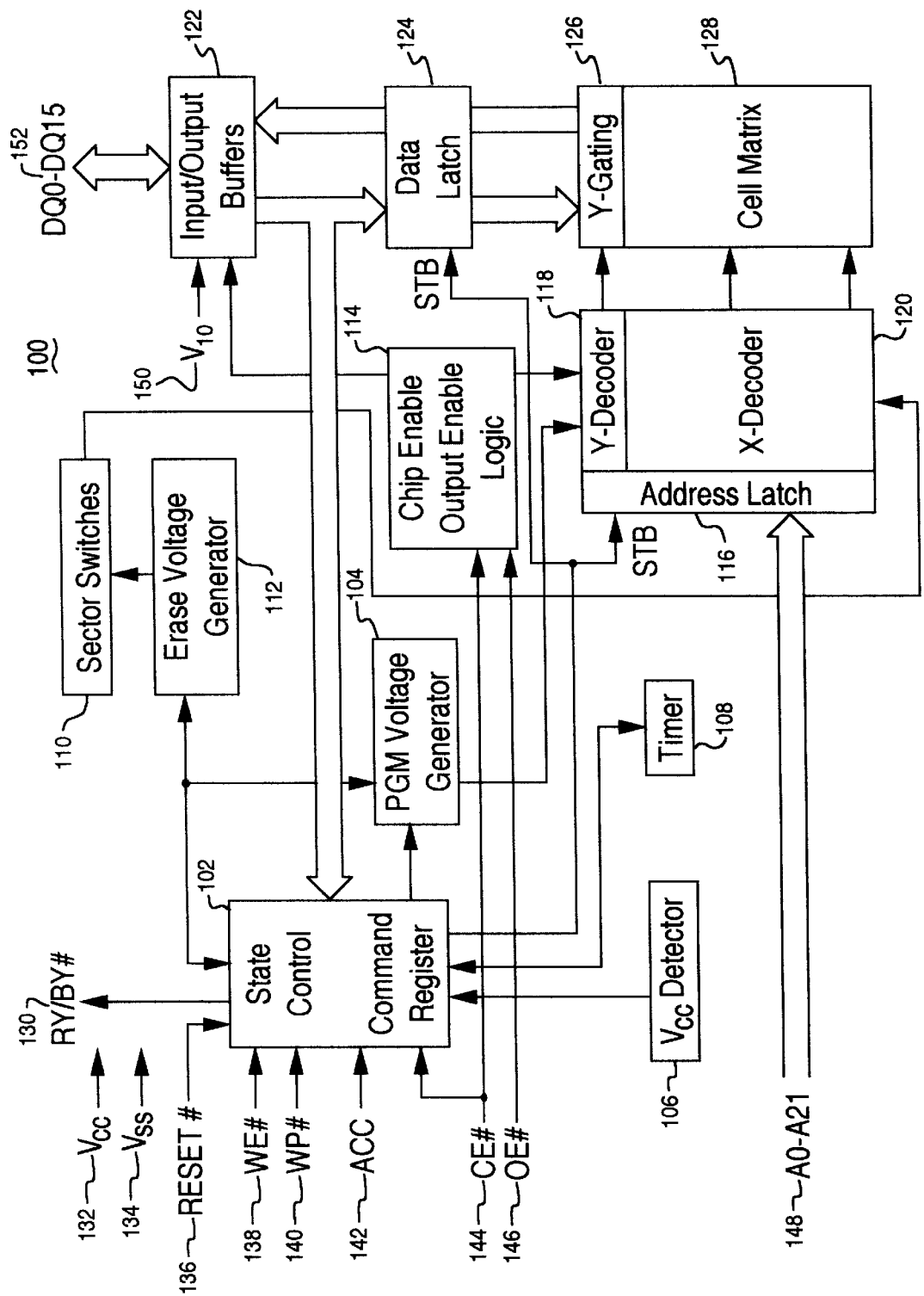
FIG. 1 depicts a block diagram of a 64 Mb flash memory chip according to the present invention.

Referring now to the Figures and in particular, FIG. 1, there is schematically shown a flash memory device 100 according to the present invention that provides 64 megabits (Mb) of storage using a single level NOR type flash memory cell. An exemplary flash memory device 100 is the Am29LV640DU and Am29LV641DU 64 Mb flash memory chips manufactured by Advanced Micro Devices, Inc., located in Sunnyvale, Calif. These devices are discussed in more detail in "Advance Information: Am29LV640DU/Am29LV641DU 64 Megabit (4 M×16-Bit) CMOS 3.0 Volt-only Uniform Sector Flash Memory with Versatile I/O™ Control," published by Advanced Micro Devices, Inc., located in Sunnyvale, Calif., herein incorporated by reference.

The exemplary flash memory device 100 utilizes a single level NOR flash memory cell which is fabricated using a 0.25 μm technology. This allows higher densities and smaller die sizes. In addition single level NOR flash memory cells require less complex programming, erase and read logic versus dual level memory cells. Further, it is easier to ensure uniform cell performance across a large array of single level NOR cells.

The device 100 includes a state control and command register 102, a program voltage generator 104, a Vcc detector 106, a timer 108, sector switches 110, an erase voltage generator 112, chip and output enable logic 114, an address latch 116, a Y-decoder 118, an X-decoder 120, input/output buffers 122, a data latch 124, Y-gating 126 and the cell matrix/array 128. The device 100 further includes inputs and outputs for ready/busy 130, labeled "RY/BY#", operating power 132, labeled "Vcc", ground 134, labeled "Vss", reset 136, labeled "RESET#", write enable 138, labeled "WE™", write protect 140, labeled "WP#", accelerate 142, labeled "ACC", chip enable 144, labeled "CE#", output enable 146, labeled "OE#", a 22 bit address input bus 148, labeled "A0–A21", output buffer power 150, labeled "Vio", and a 16 bit data input/output bus 152, labeled "DQ0–DQ15". The # following a signal name indicates that this signal is asserted when it has a low logic value (active low). In one embodiment, all of the components of FIG. 1 are contained on a single integrated circuit chip. The operation and use of these input and output signals is further explained in the above mentioned reference. Note that the exemplary flash memory device 100, having 64 megabits (or 8 megabytes) is word addressable and therefore accommodates a 22 bit address input 148 and a 16 bit data input/output 152. It will be appreciated that the data size granularity with which the device 100 can be accessed can vary with the implementation and amount of total storage, with a smaller granularity requiring more input address bits and fewer data input/output bits and vice versa, and all such implementations are contemplated. For example, a device 100, having 64 megabits of storage, which is byte addressable requires 23 address bit inputs 148 and 8 data input/outputs 152. In another alternative, the device 100 supports both word and byte addressing on the same integrated circuit.

The state control and command register 102 includes the state machine and control logic which controls the operation of the device 100. This includes controlling the embedded programming and erase operations as well as other general operations of the device 100, which are discussed in more detail below. The state control and command register is responsive to the reset input 136, the write enable input 138, the write protect input 140, the accelerate input 142 and the chip enable input 144. The reset input is used to perform a hardware reset of the device 100. The write enable input 138 is used to signal the device 100 that data is to be stored in the array 128. The write protect input 140 is used to control the write protect functions of the device 100 which prevent accidental erasure of the contents stored in the array 128. The accelerate input 142 is used to speed up programming and erase functions. The chip enable input 144 is used to enable access to the device 100. The state control and command register further includes a ready/busy output 130 which indicates when the device is busy undergoing an embedded operation.

The PGM voltage generator 104 generates the necessary voltages for programming the flash memory cells of the cell matrix/array 128. The erase voltage generator 112 generates the necessary voltages for erasing the flash memory cells of the array 128. The voltage generators 104 and 112 contain voltage pumps (not shown) and switching multiplexors (not shown) which generate and route the necessary high voltages for erasing and programming flash memory cells as well as generating the necessary voltages for read operations under the direction of the state control and command register 102. These voltage pumps include a VPXGG pump, a voltage booster circuit, a VPPIG pump, a drain pump and a negative pump.

The VPXGG pump is a positive power supply for generating and supplying a regulated positive potential to the control gate of selected flash memory cells via the word lines. Many different voltage pumps known in the art are suitable for use in the present invention. A more detailed explanation of one technology which can be included in VPX(GG pump can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference.

During read operations, the voltage booster is used to boost the word line voltage while the drain pump is used to boost the bit line voltage prior to sensing the output voltage levels. A more detailed description of one exemplary implementation of a voltage booster circuit can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

The VPPIG pump is a high voltage pump used to pass high voltage to the drain of the memory cells. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference.

The negative pump is used to generate a relatively high negative voltage to the control gates of selected memory cells via the word lines. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

Referring back to FIG. 1, the flash memory device 100 further includes a Vcc detector 106 which detects when normal operating power is applied to the device 100. The Vcc detector 106 signals the state control and command register 102 when proper Vcc is detected. The timer 108 is used by the state control and command register 102 to properly control and synchronize the embedded program and erase operations. The sector switches 110 are used to route the voltages used during the erase operation to the proper sectors which are undergoing erase. The Chip and output enable logic 114 is responsive to the chip enable 144 and output enable 146 inputs. This logic is used to enable the device 100 to receive and pass data via the input/output buffers 122. The address latch 116 receives the address for a read or write operation from the address inputs 148. The address latch 116 latches the address for subsequent decoding. The Y-decoder 118 decodes the column address in the memory array 128 from the address latched in the address latch 116 . The X-decoder 120 decodes the row address in the memory array 128 from the address latched in the address latch 116. The input/output buffers 122 buffer read data that is being output and write data that is being input to/from the external data bus 152 of the device 100. The input/output buffers receive power from an external voltage source, Vio 150. The data latch 124 latches and holds data being written to the array 128 coming from the input/output buffers 122 or data being read from the array 128 going to the buffers 122. The data latch 124 holds the data steady so it can be written or output depending on the operation underway. The Y-gating 126 gates the data being read from or written to the array 128. The cell matrix/array 128 includes an array of flash memory cells arranged in a row and column addressable format. Alternatively, the cell matrix/array 128 may include one or more banks to subdivide the accessible memory along with the additional hardware necessary to support multiple banks. The individual memory cells in the array 128 are further sub-grouped into sectors such that one or more sectors may be erased at any given time. In the exemplary flash memory device 100, the array 128 is arranged as 128 64 kilobyte sectors. It will be appreciated that there are many ways to implement the basic structure of the flash memory device 100 including alternate input/output interfaces, alternate memory array structures along with accompanying supporting logic and all such alternatives are contemplated.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state control and command register 102, which uses a command register to manage the commencement of either sequence. The erase and programming operations are only accessed via the command register which controls an internal state machine that manages device operations. Commands are written to the command register via the data inputs 152 to the memory device 100.

In the memory device 100, each memory cell, within the cell array 128, includes a single level nor-type floating gate transistor (not shown). It will be appreciated by those skilled in the art, however, that there are many ways to implement a single level flash memory cell and that the configurations and operating characteristics may vary. It will further be appreciated that the embodiments disclosed herein are generally applicable and not limited to one particular implementation of a single level flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump. An exemplary high positive voltage applied to the source during an erase is approximately 5 volts and an exemplary high negative voltage applied to the control gate/word line by the negative pump is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply and the control gate/word line is connected to a high voltage provided by the VPXGG pump positive power supply. An exemplary high voltage applied to the drain by the VPPIG is approximately 5 Volts while an exemplary high voltage applied to the control gate by the VPXGG pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell requires higher than normal voltages, reading from the cell only requires the availability of the normal supply voltage. To read from the memory cell, the source is connected to ground (also referred to as Vss) and the control gate/word line are connected to the booster power supply. Prior to selecting the transistors for a read, the bit lines are charged up via the drain pump. When the cells turn on (if erased), they will connect their respective bit line to ground, grounding out the bit line. The current value of the memory cell is then sensed from the drain/bit line connection. The booster power supply is used to boost the word lines during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state command and control register 102. This logic 102 controls the multiplexors that place the proper voltages from the various power supplies and Vcc on the memory cell inputs depending on the desired function.

As was noted above, during a read operation, the word lines of the flash memory cells to be read are connected to a booster power supply to boost the gate voltage relative to the threshold voltage of flash memory cells. In the preferred embodiments, the values or stored voltages in the flash memory cells are then read using differential sense amplifiers. A differential sense amplifier senses the voltage from the drains of the flash memory cells and compares it to a reference voltage provided by the drain of a reference flash memory cell. This comparison determines the value stored in the memory cell (i.e. whether the cell is programmed or erased based on the sensed voltage). In order for a differential sense amplifier to function properly and avoid outputting incorrect data, the reference cell must be subjected to the same electrical conditions as the memory cell. If the response time? signal strength or other electrical characteristics, such as the signal rise and fall times, of the reference cell are not substantially similar to the memory cell, these differences (and not the fact that the memory cell and reference cell may truly store different values) may cause the sense amplifier to mis-compare resulting in an incorrect output. The differential sense amplifier generates its output based only on the substantially simultaneous sensing of the stored voltage signals from the memory and reference cell (e.g., whether the cell is programmed or erased and is passing or blocking the drain/ground connection, etc. as described above).

Electrical conditions which affect the differential sense amplifiers include the electrical properties of the signal paths and routing logic which couple the reference and memory cells to the sense amplifier. For a description of exemplary signal paths and exemplary logic utilized to equalize these electrical properties in a variable size dual bank flash memory device, see co-pending and commonly assigned U.S. patent application Ser. No. 09/421,775, entitled "REFERENCE CELL BITLINE PATH ARCHITECTURE FOR A SIMULTANEOUS OPERATION FLASH MEMORY DEVICE" filed Oct. 19 1999.

In addition to the logic and signal paths coupling the reference and memory cells with the sense amplifiers, electrical conditions which also affect the operation of the differential sense amplifiers further include the logic and signal paths used to decode and select which memory cells to read from and distribute the word line power from the booster power supply to the gates of the selected sells. The reference cell gate voltage must be subjected to same electrical conditions as the gate voltage of the selected memory cell in order ensure that the differential sense amplifiers see equivalent electrical characteristics in the sensed voltages.

Figure 2:
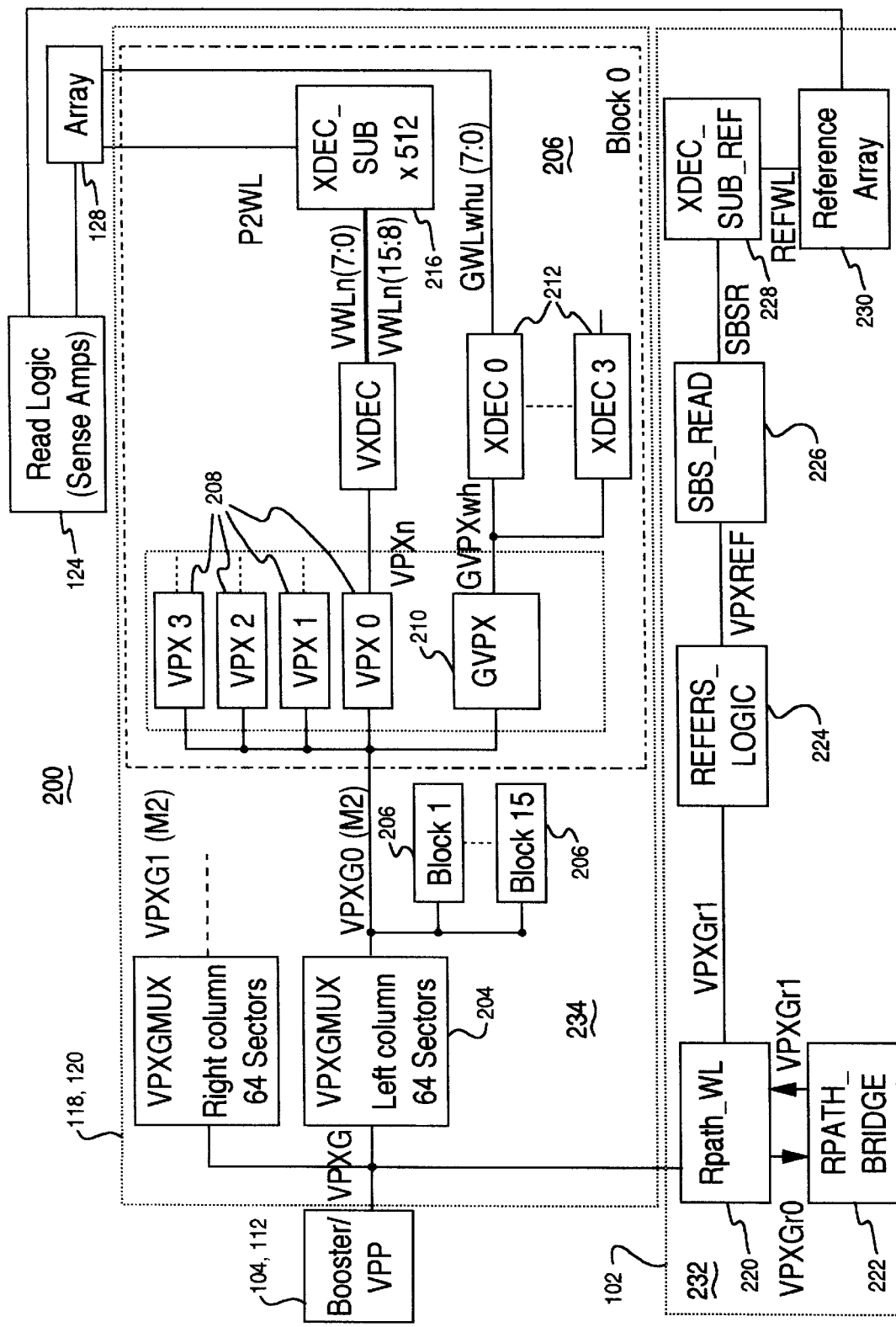
FIG. 2 depicts a block diagram showing a preferred embodiment of the core array and reference array power distribution circuits.

In one embodiment of the present invention, an equalization circuit is provided to equalize the electrical characteristics of the reference voltage path 232 of memory device 100 to those of the wordline voltage path 234. Referring now to FIG. 2, there is shown a schematic diagram of the flash memory device 100 of FIG. 1 showing the reference 232 and wordline 234 voltage paths in more detail. For the sake of clarity, a number of the components of FIG. 1 have been deleted in FIG. 2. Both the wordline voltage path 234 and the reference voltage path 232 are coupled with the voltage generators 104, 112, labeled "Booster/VPP" in FIG. 2. The booster/VPP voltage generators 104, 112, under the control of the state control and command register 102, provide the necessary voltages for the wordlines of the memory array 128 and the reference array 230 during program, erase and read operations.

The flash memory cells of the memory array 128 are logically and physically divided into two columns, left and right. Each column is further subdivided into 16 blocks with each block subdivided into 4 sectors and each sector comprising 64 Kilobytes (524,288 or 512K) flash memory cells. There is 1 wordline each 1 K (1024) flash memory cells for a total of 512 wordlines per sector. There is 1 global wordline for each 64 K (65536) flash memory cells for a total of 8 global wordlines per sector. The global wordlines are not really wordlines but are used to decode the actual wordlines for each of the 4 sectors in the block. The wordline voltage path 234 decodes and distributes the wordline voltage, labeled "VPXG", from the Flooster/VPP power supplies 104, 112 into the memory array 128 to the wordlines. The wordline voltage path 234 includes multiplexer circuits 202, 204, labeled "VPXGMUX", for each column. The output of the VPXGMUX 202 for the right column is labeled "VPXG1" and the output of the VPXGMUX 204 for the left column is labeled "VPXG0". The signal paths for VPXG0 and VPXG1 are implemented in the second metal layer of the integrated circuit which comprises the device 100. In the preferred embodiment, the VPXG0 and VPXG1 signal paths are each 8090 microns long and 3.6 microns wide.

Each VPXGMUX is coupled with sector decoding logic 206 for each block, labeled "Block 0" through "Block 15" of the corresponding column. Within each sector decoding logic 206, there are 4 sector wordline decoders 208, labeled "VPX0" through "VPX3". The output of each of the sector wordline decoders 208 is labeled "VPXn" where "n" is the identifier of the particular sector wordline decoder 208. Each sector wordline decoder is connected a high voltage decoder 214, labeled "VXDEC". Each high voltage decoder 214 has 16 outputs, labeled "VWLn(16:0)" where "n" is the identifier of the particular sector wordline decoder 208. Each output of the high voltage decoder 214 is coupled with 32 wordline distribution circuits 216, labeled "XDEC_SUB". In each sector decoding logic 206, there are a total of 512 wordline distribution circuits 216, 4 high voltage decoders 214 and 4 sector wordline decoders 208. Overall, each column in the memory array 128 includes 16 sector decoding logic 206, 64 sector wordline decoders 208, 64 high voltage decoders 214 and 32768 wordline distribution circuits 216.

The sector decoding logic 206 further includes 1 global wordline decoder 210, labeled "GVPX" coupled with the output of the corresponding VPXGMUX. The output of the GVPX circuit 210, labeled "GVPXwh", is coupled with 4 global wordline distribution circuits 212, labeled "XDEC0" through "XDEC3", one for each sector. Each global wordline distribution circuit 212 has eight outputs, labeled "GWLwhu(7:0)" where "u" is the identifier of the corresponding global wordline distribution circuit 2 12. Each output of the global wordline distribution circuit 212 is coupled with a global wordline in the array. In each sector decoding logic 206, there are a total of 4 global wordline distribution circuits 212 and 1 global wordline decoder 210. Overall, each column in the memory array 128 includes 16 global wordline decoders 210 and 64 global wordline distribution circuits 212.

Figure 16:
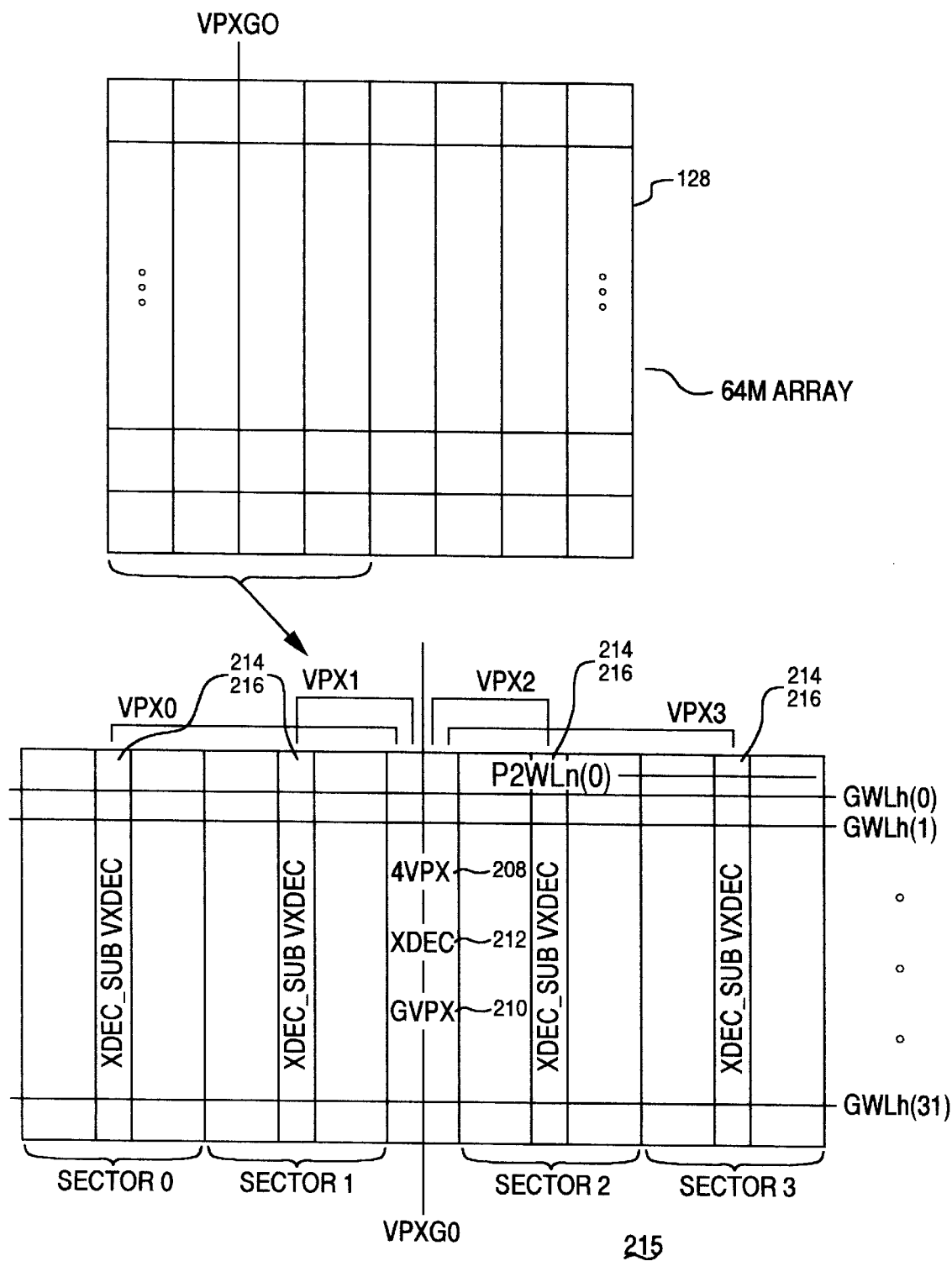
FIG. 16 depicts a block diagram of the structure of the core memory array showing the placement of the circuits depicted in FIGS. 4–8.

FIG. 16 shows a more detailed layout of the circuits of FIGS. 4–8, and described in more detail below, and how they are arranged within the memory 128.

The reference voltage path 232 distributes the wordline voltage from the Booster/VPP power supplies 102, 112 to the reference flash memory cells in the reference array 230. In addition, the reference voltage path 232 must equalize the electrical conditions (e.g., the loading consisting of resistance and capacitance) of the wordline voltage distributed to the reference array 230 to the conditions of the wordline voltage distributed to the memory array 128. This includes matching the loading (which includes the capacitance and resistance) placed on the wordline voltage by the VPXGMUX, VPX, GVPX, VXDEC, XDEC, XDEC_SUB circuits as well as the interconnecting signal paths of these circuits.

The reference voltage path 232 includes an RPATH_WL circuit 220, an RPATH_WL_BRIDGE circuit 222, a REFERS_LOGIC circuit 224, an SBS_READ circuit 226, an XDEC_SUB_REF circuit 228 and a reference array 230. Each of the circuits 220, 222, 224, 226 and 228 includes circuitry and logic which matches the electrical characteristics of the reference voltage path 232 to those of the wordline voltage path 234.

Figure 3:
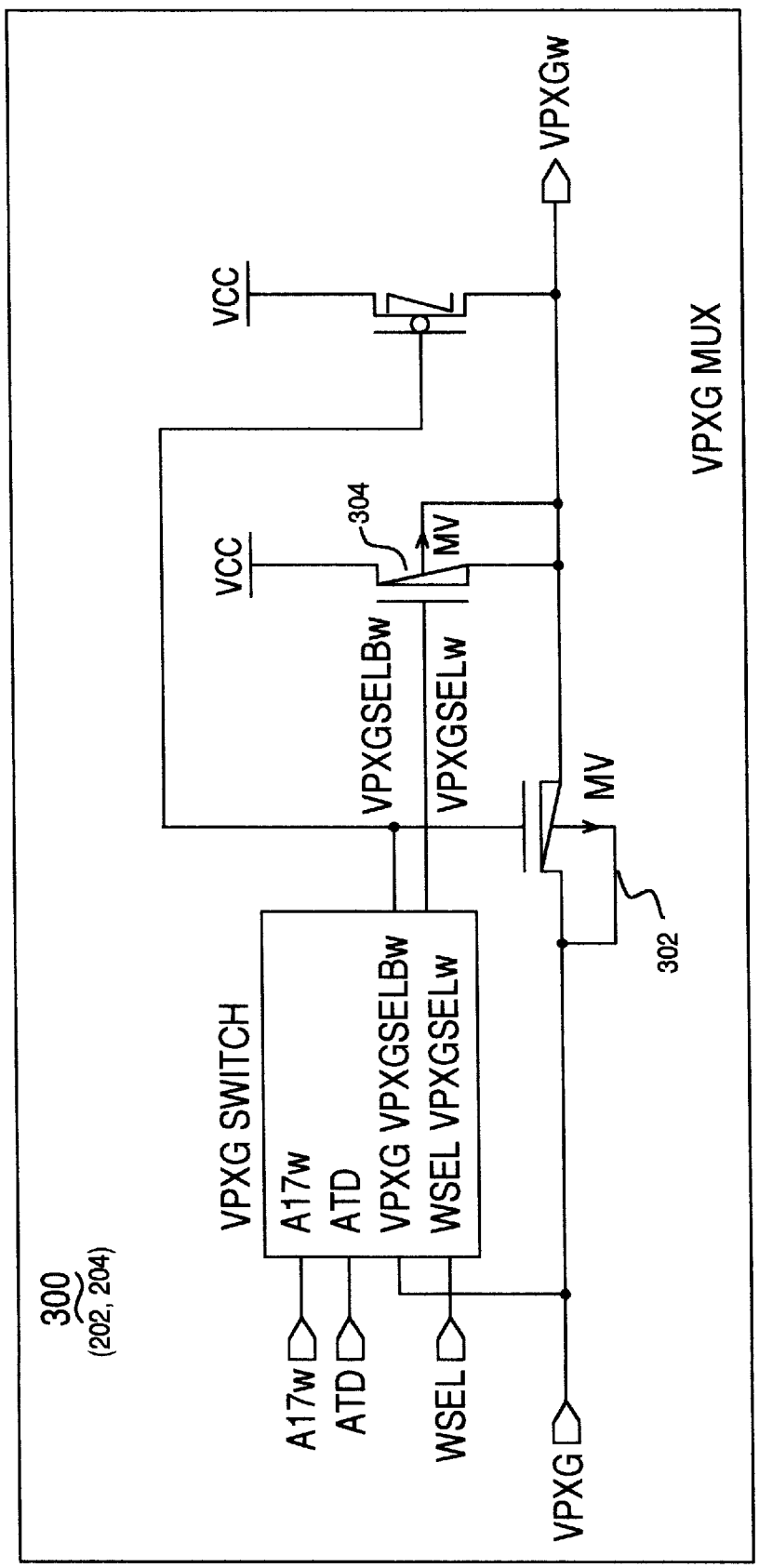
FIG. 3 depicts a schematic diagram of a VPXGMUX circuit for use with the embodiment of FIG. 2.

Referring now to FIG. 3, there is shown a schematic diagram 300 of a VPXGMUX circuit 202, 204. Each VPXG- MUX circuit 202, 204 is designed to route the wordline voltage to either the left or right column of the array. When a particular column is not being operated upon (read, programmed or erased), the VPXGMUX shuts that column down so as not to drain the Booster/VPP power supply 104, 112 unnecessarily. When the column is selected, p-channel transistor 302 between the input, labeled "VPXG" and the output, labeled "VPXGw" is turned on while p-channel transistor 304 is turned off. When the column is not selected, p-channel transistor 302 is turned off and p-channel transistor 304 is turned on, effectively decoupling that column from the booster supply 104, 112. In this way, loading on the booster supply 103, 112 is reduced. It will be appreciated that there are alternative multiplexing circuits that can be used.

The following description specifically describes the wordline voltage path for the left column. The VPXGMUX circuit 204 for the left column outputs the wordline voltage over the VPXG0 signal path which is implemented in the second metal layer of the integrated circuit. It will be appreciated that the circuits for the right column are identical to those of the left column and coupled with the VPXGMUX circuit 202 for the right column via the VPXG1 signal path also implemented in the second metal layer of the integrated circuit.

Figure 4:
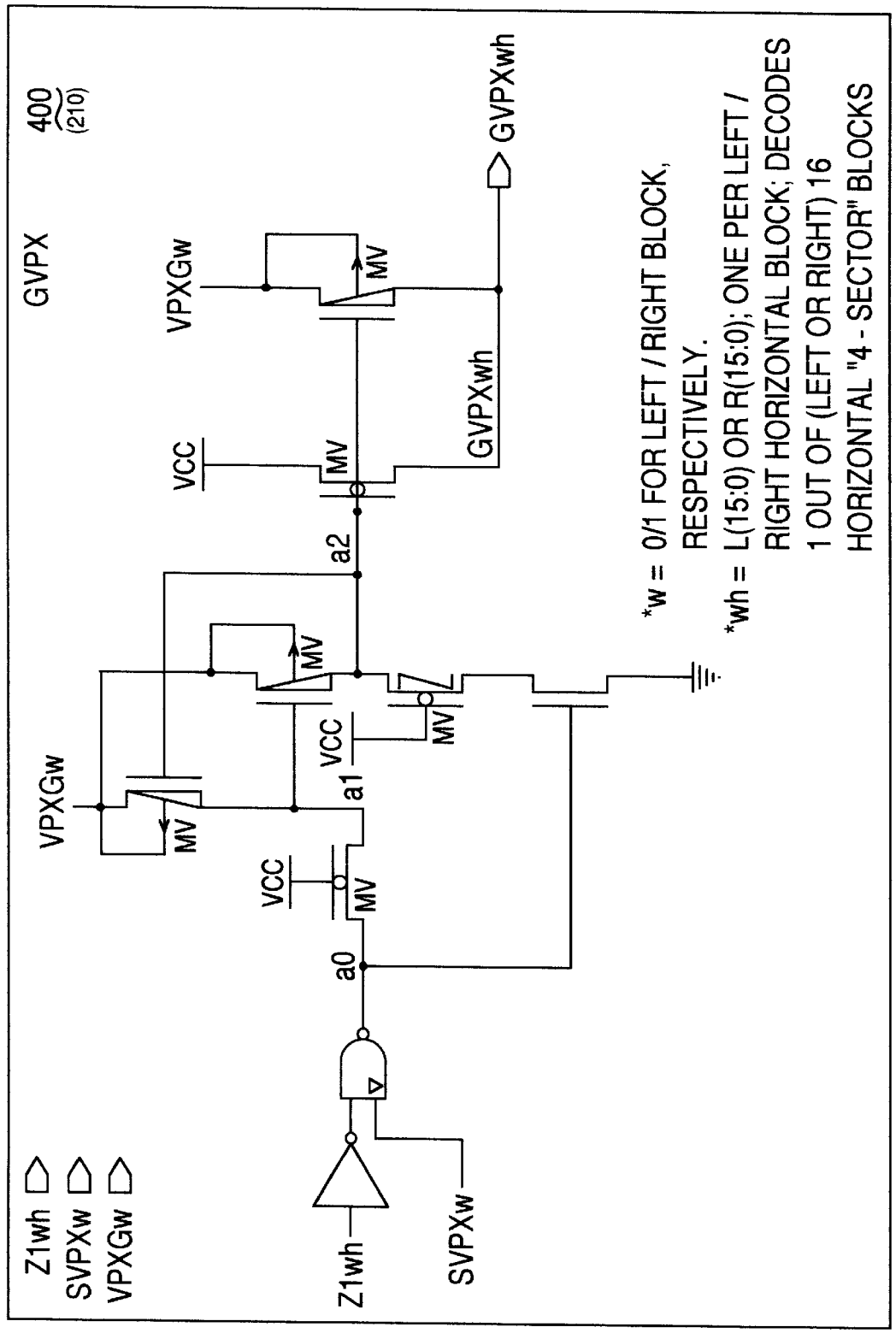
FIG. 4 depicts a schematic diagram of a GVPX circuit for use with the embodiment of FIG. 2.

Referring now to FIG. 4, there is shown a schematic diagram 400 of a GVPX circuit 210. There is one GVPX circuit 210 for each block of four sectors for a total of 16 in the left column of the memory array 128. The GVPX circuit 210 decodes and distributes the wordline voltage to the XDEC circuits 212 for the global wordlines of each sector of the block The output of the GVPX circuit 210 is labeled "GVPXwh".

Figure 5:
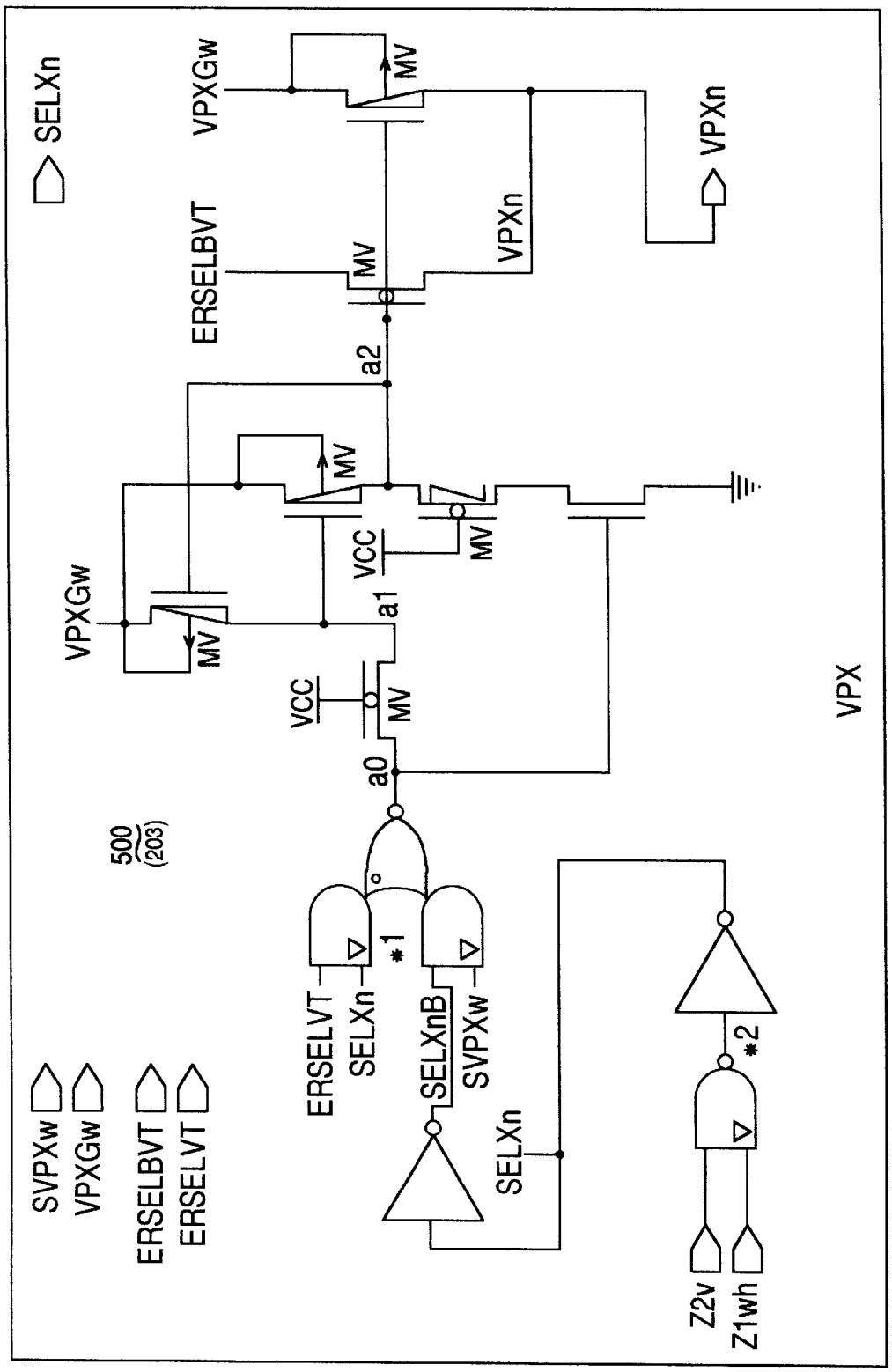
FIG. 5 depicts a schematic diagram of a VPX circuit for use with the embodiment of FIG. 2.

Referring now to FIG. 5, there is shown a schematic diagram of a VPX circuit 208. There are 4 VPX circuits 208, 1 for each sector in the block for a total of 64 VPX circuits 208 in the left column of the memory array 128. Each VPX circuit 208 decodes and distributes the wordline voltage to a corresponding VXDEC circuit 214. The output of each VPX circuit 208 is labeled "VPXn" where "n" identifies the corresponding VPX circuit 208.

Figure 6:
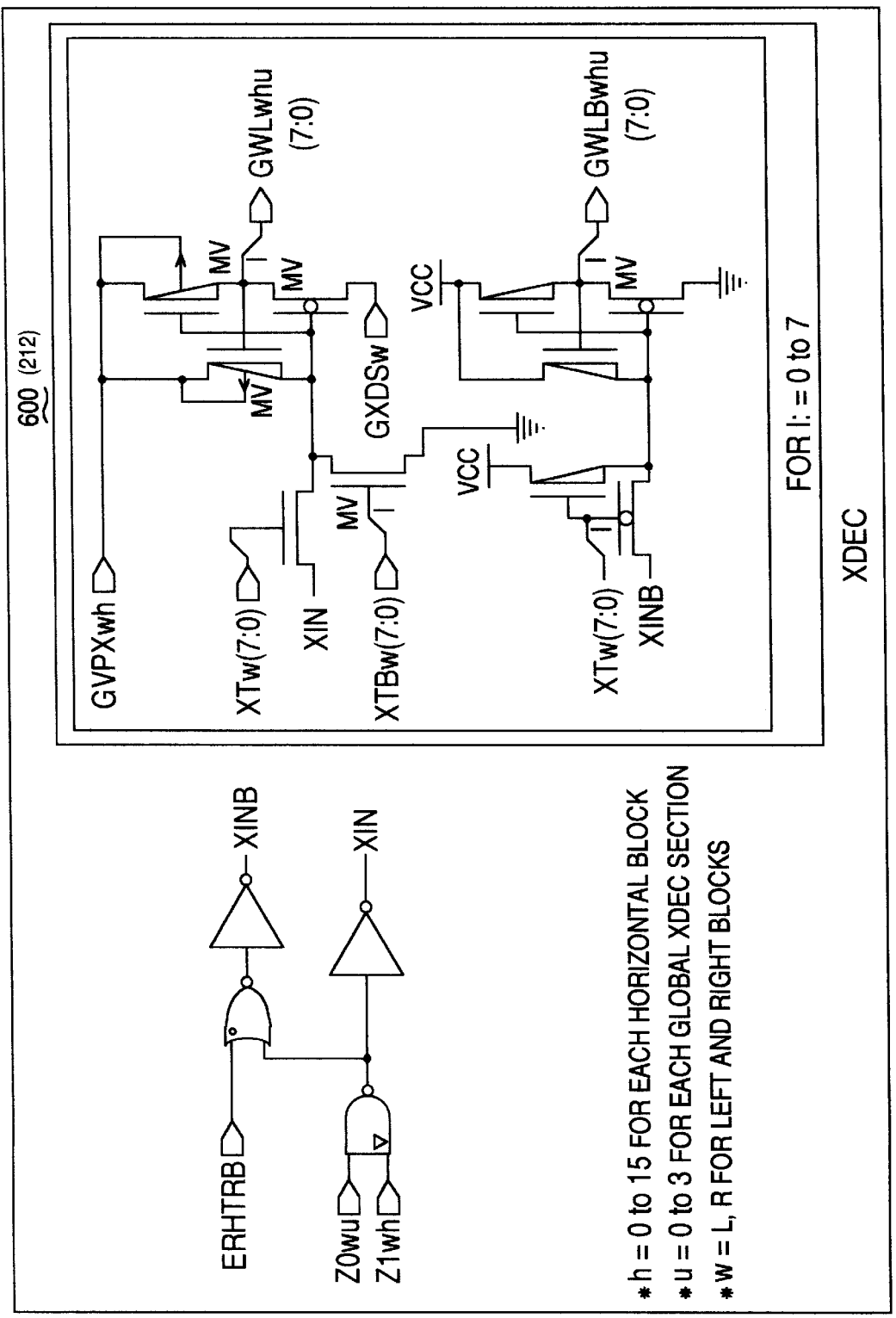
FIG. 6 depicts a schematic diagram of a XDEC circuit for use with the embodiment of FIG. 2.

Referring now to FIG. 6, there is shown a schematic diagram 600 of a XDEC circuit 212. There is one XDEC circuit 212 for each sector of the block for a total of 64 XDEC circuits 212 in the left column of the memory array 128. The XDEC circuit 212 receives the global wordline voltage via the GVPXwh signal path and distributes it to the eight global wordlines of its corresponding sector via the signal paths labeled GWLwhu(7:0). Since there are 4 XDEC circuits 212 in each block which comprises 4 sectors, there are a total of 32 global word lines in one block. The 32 global word lines signals are used to decode the word lines in the 4 sectors of the block.

Figure 7:
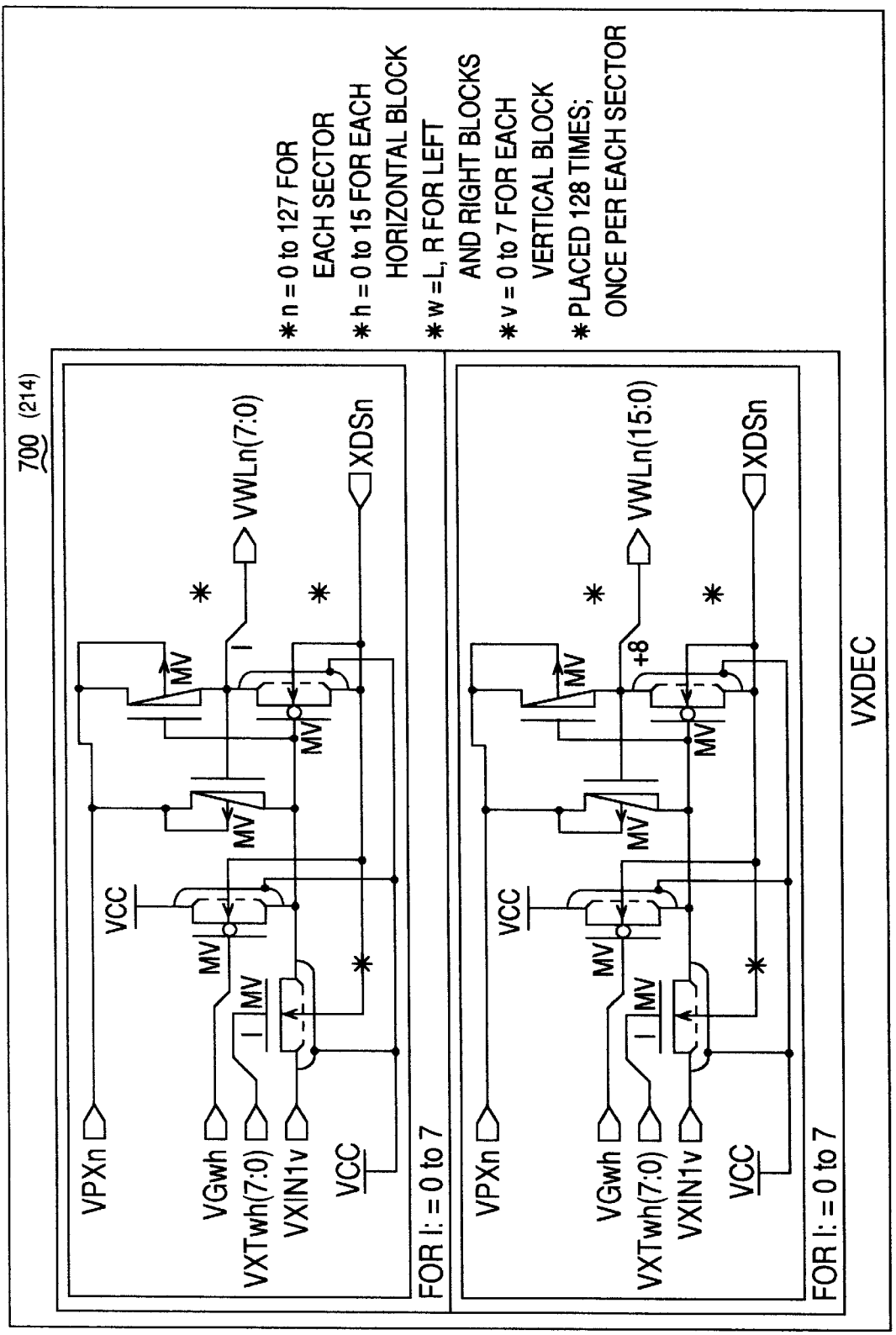
FIG. 7 depicts a schematic diagram of a VXDEC circuit for use with the embodiment of FIG. 2.

Referring now to FIG. 7, there is shown a schematic diagram 700 of a VXDEC circuit 214. There is one VXDEC circuit 214 corresponding to each VPX circuit for a total of 4 VXDEC circuits in each block and 64 in the left column. The VXDEC circuit 214 receives the wordline voltage from the corresponding VPX circuit 208 via the VPXn signal path. Each VXDEC circuit 214 further decodes and distributes the wordline voltage to corresponding XDEC_SUB circuits 216 via the 16 signal paths labeled "VWLn(15:8)" and "VWLn(7:0)". The 16 VWL signals are used to decode the wordlines within each sector.

Figure 8:
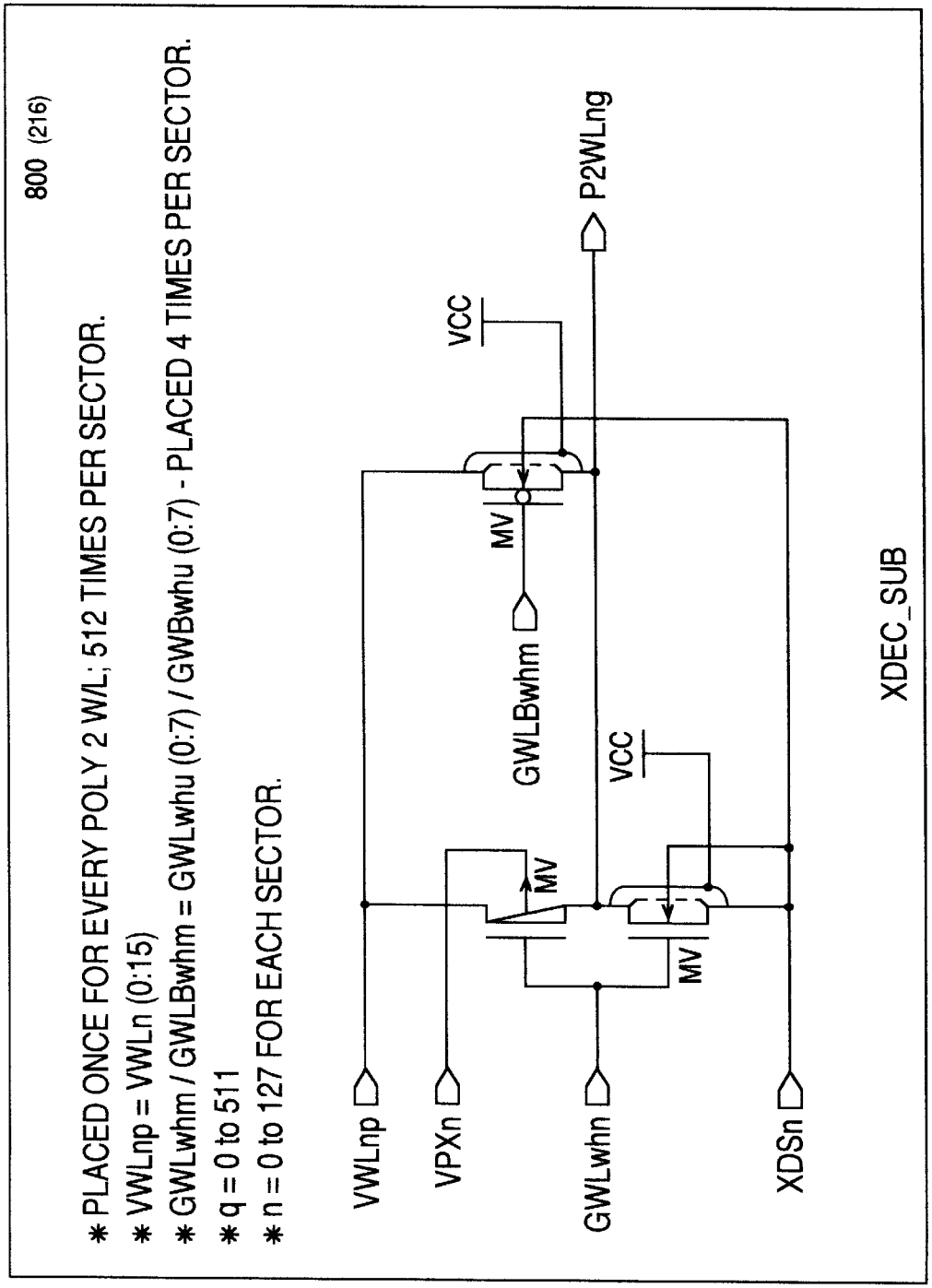
FIG. 8 depicts a schematic diagram of a XDEC_SUB circuit for use with the embodiment of FIG. 2.

Referring now to FIG. 8, there is shown a schematic diagram 800 of a XDEC_SUB circuit 216. There are 512 XDEC_SUB circuits 216 for each VXDEC circuit 214 for a total of 2048 in each block and 32768 in the left column. The XDEC_SUB circuit 216 drives the wordline voltage onto the wordlines of the memory 128. Each of the 16 VWLn(15:0) signal paths is coupled with 32 XDEC_SUB circuits 216. Each XDEC_SUB circuit 216 has an output labeled "P2WL" which is one of the wordline of the memory array 128. The P2WL wordlines are implemented in the second polysilicon layer of the integrated circuit comprising the flash memory device 100. 16 VWL, signals and 32 global wordlines decode 512 wordlines in each sector (16× 32).

The following descriptions describe the reference voltage distribution path 232 of the device 100. There is one reference voltage distribution path 232 which distributes the wordline power from the Booster/VPP power supplies 104, 112 to the reference array 230 no matter which column of the memory array 128, left or right, is active and being operated upon.

Figure 9:
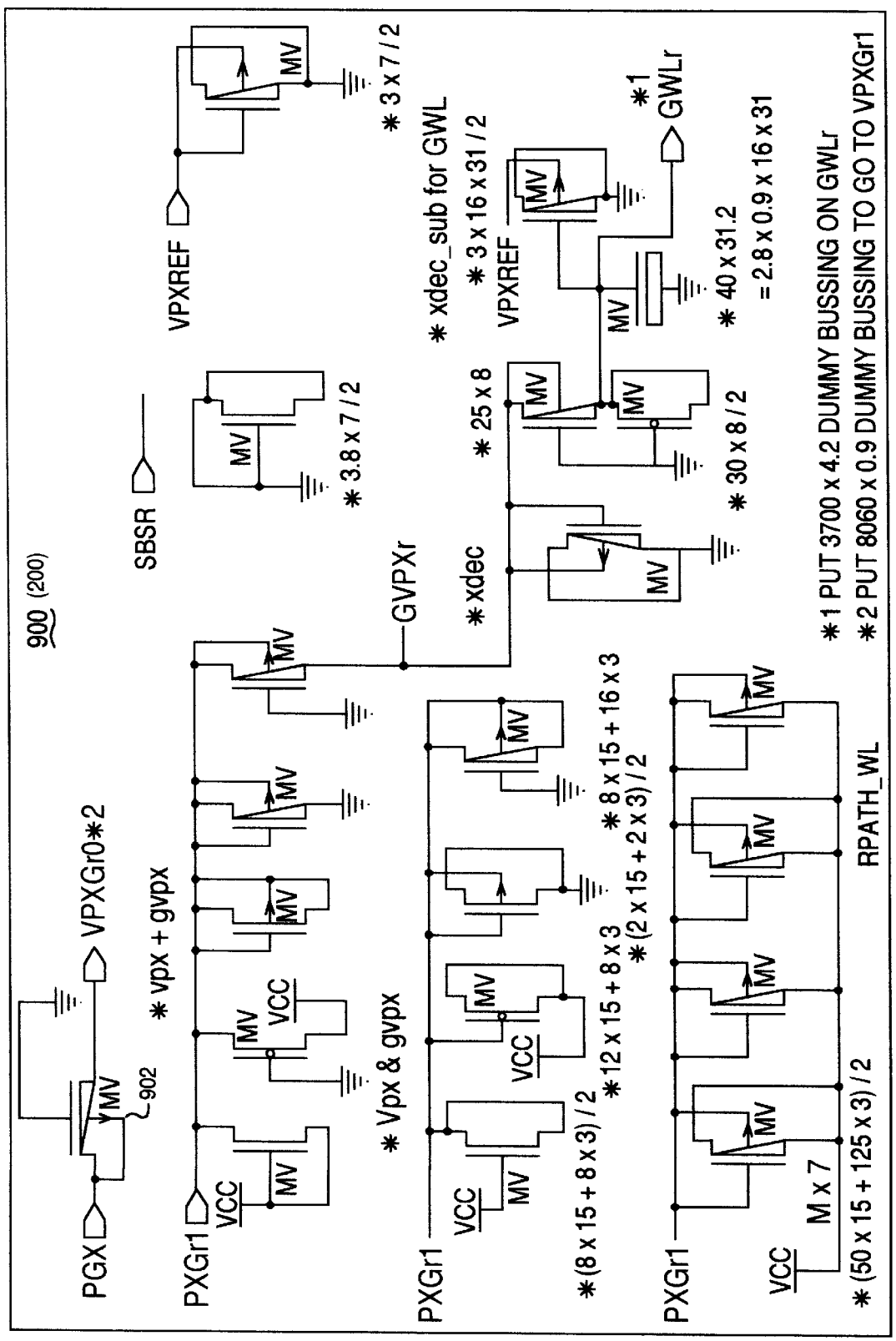
FIG. 9 depicts a schematic diagram of a RPATH_WL circuit for use with the embodiment of FIG. 2.

Referring now to FIG. 9, there is shown a schematic diagram 900 of a RPATH_WL circuit 220. The RPATH_WL circuit 220 receives the wordline voltage from the Booster/VPP power supplies 104, 112. The function of the RPATH_WL circuit 220 is to equalize the loading on the reference voltage distribution path 232 with the loading placed on the wordline voltage distribution path 234 by the GVPX circuits 210 and the XDEC circuits 212 of the column of the memory array 128 undergoing an operation. Each column has 16 GVPX circuits 210 and 64 XDEC circuits 212. As will be described below, the RPATH_WL circuit 220 only needs to provide for loading equivalent to 4 GVPX circuits 210 and 16 XDEC circuits 212 do the capacitance of the RPATH_WL_BRIDGE circuit 222.

Figure 10:
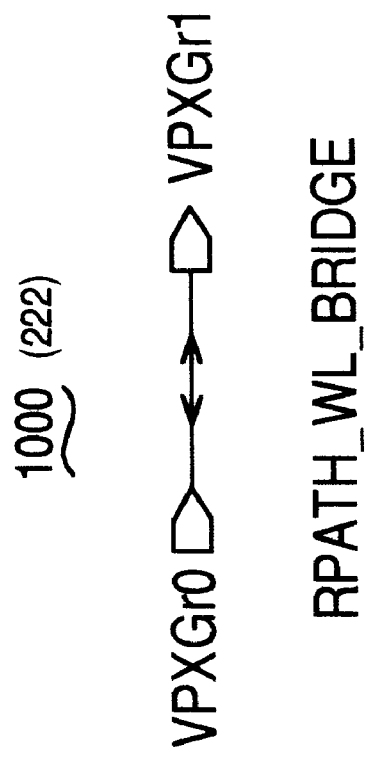
FIG. 10 depicts a schematic diagram of a RPATH_WL_BRIDGE circuit for use with the embodiment of FIG. 2.

Referring now to FIG. 10, there is shown a schematic diagram 1000 of a RPATH_WL_BRIDGE circuit 222. The RPATH_WL_BRIDGE circuit 222 consists of dummy metalization used to extend the voltage signal path. The VPXG wordline voltage from the Booster/VPP power supplies 104, 112 is input to the RPATH_WL circuit which passes it through logic 902 and then to the RPATH_WL_BRIDGE circuit 222 via the VPXGR0 signal path. The circuits 902 equalize the electrical characteristics of reference voltage distribution path 232 for the p-channel transistors 302, 304 of the VPXGMUX 204 (shown in FIG. 3). The voltage is then passed over the dummy metalization and returned to the RPATH_WL circuit via the VPXGR1 signal path. The length of the dummy metalization of the RPATH_WL_BRIDGE is preferably 8090 microns which is equivalent to the length of the VPXG0 and VPXG1 signal paths. However, it is L5. further preferable that the width of the dummy metalization be ¼ of the width of the VPXG0 and VPXG1 signal paths to save area while achieving the same delay and loading. In the preferred embodiment, the width of the dummy metalization is 0.9 microns. By reducing the width of the dummy metalization, the resistance is quadrupled. In computing circuit delay as a function of resistance, R and capacitance C, delay=RC. A signal path with four times the resistance, R, requires ¼ of the capacitance to achieve the same delay as a signal path with resistance R. Therefore, as noted above, the RPATH_WL circuit 220 only needs to provide loading equalization for 4 GVPX circuits 210 and 16 XDEC circuits 212.

Figure 11:
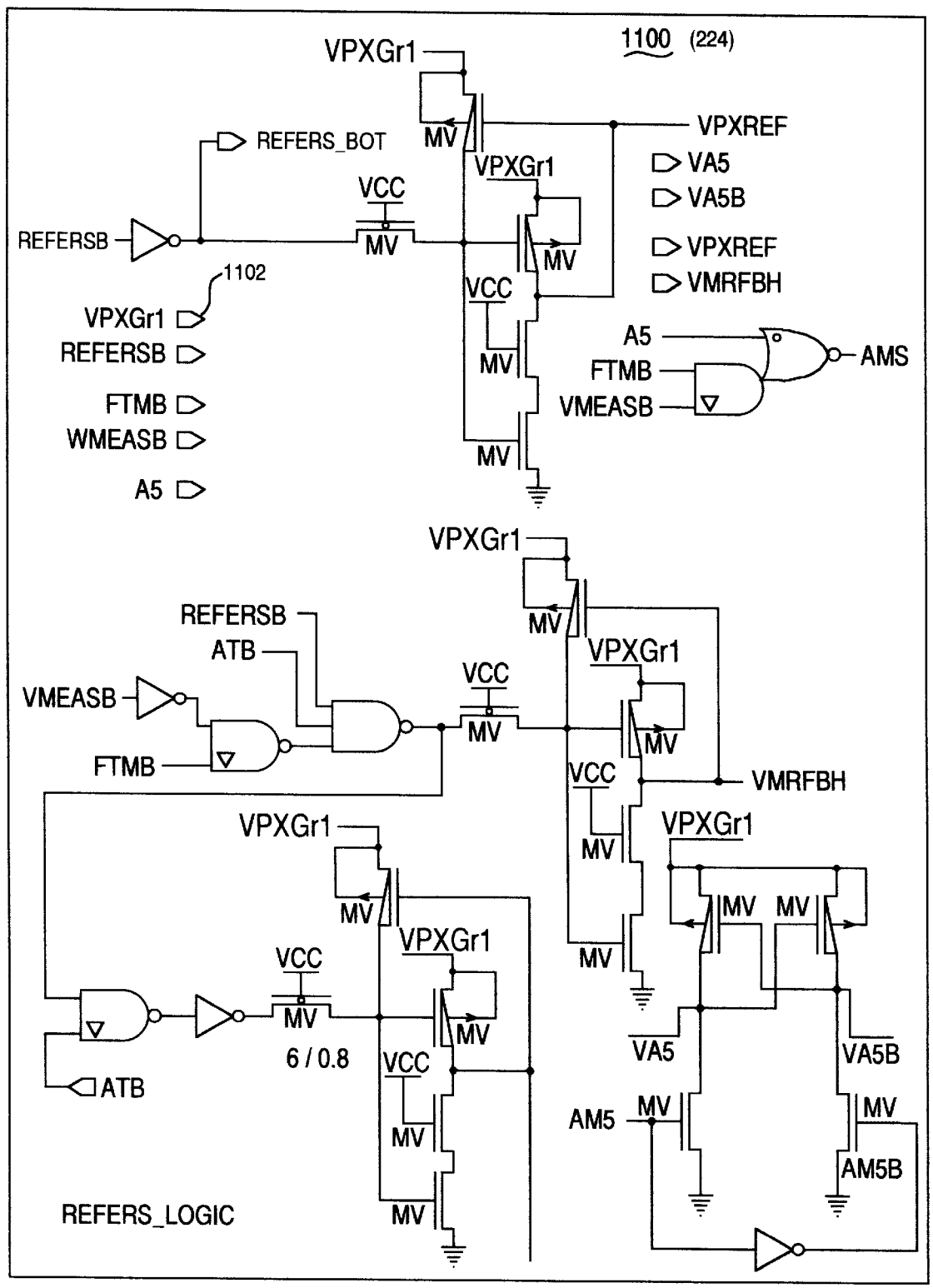
FIG. 11 depicts a schematic diagram of a REFERS_LOGIC circuit for use with the embodiment of FIG. 2.

Referring now to FIG. 11, there is shown a schematic diagram 1100 of a REFERS_LOGIC circuit 224. The REFERS_LOGIC circuit 224 equalizes the loading of the reference voltage distribution path 232 to the loading placed on the wordline voltage distribution path 234 by the 64 VPX circuits 208. The REFERS_LOGIC circuit 224 has an input 1102 for the VPXGR1 signal from the RPATH_WL 220 and RPATH_WL_BRIDGE 222 circuits and an output 1104, labeled "VPXREF", which goes to the SBS_READ circuit 226 (described in more detail below).

Figure 12:
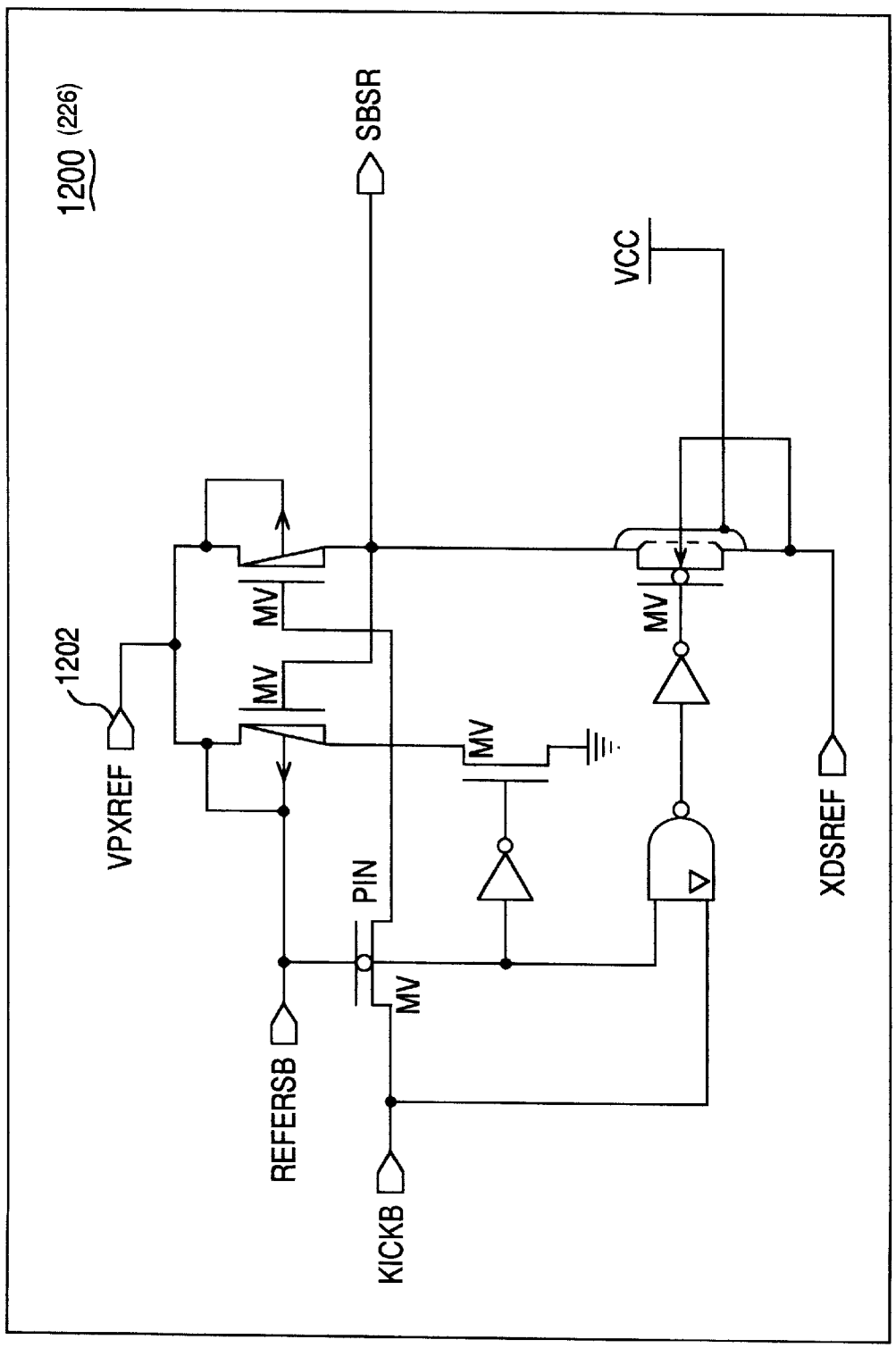
FIG. 12 depicts a schematic diagram of a SBS_READ circuit for use with the embodiment of FIG. 2.

Referring now to FIG. 12, there is shown a schematic diagram 1200 of a SBS_READ circuit 226. The SBS_READ circuit 226 equalizes the loading of the reference voltage distribution path 232 to the loading placed on the wordline voltage distribution path 234 by the 64 VXDEC circuits 214. When the input, labeled "KICKB" goes low (indicating that the wordline is being boosted), the output signal, labeled "SBSR" is switched from the input labeled "XDSREF" and connected to the input labeled VPXREF. The SBS_READ circuit 226 has an input 1202 for the VPXREF signal from the REFERS_LOGIC circuit 224 and output 1204, labeled "SBSR", for a signal, labeled "SBSR" in FIG. 2, which is the equalized voltage path. The SBSR signal goes to the XDEC_SUB_REF circuit 228 (described in more detail below).

Figure 13:
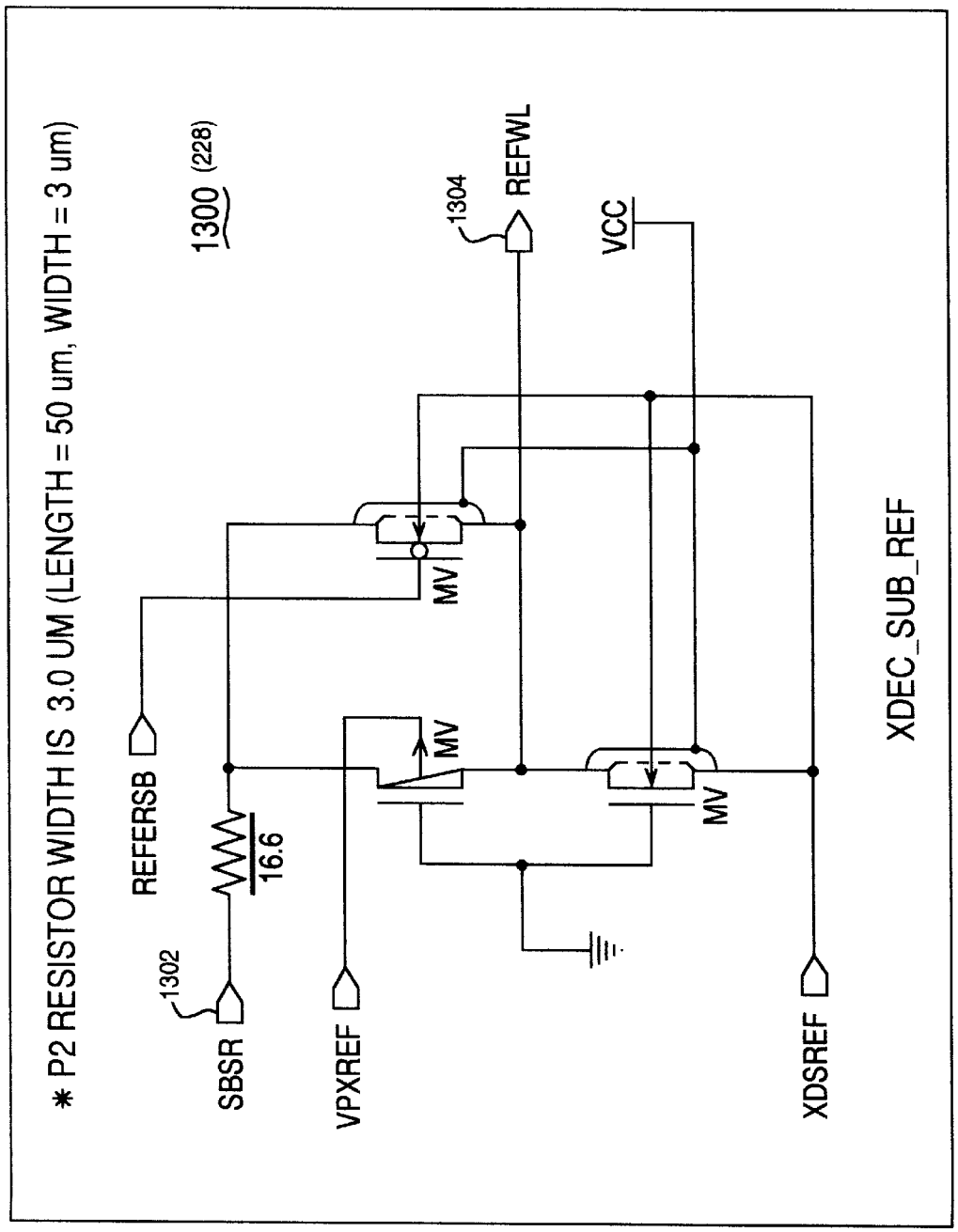
FIG. 13 depicts a schematic diagram of a XDLC_SUB_REF circuit for use with the embodiment of FIG. 2.

Referring now to FIG. 13, there is shown a schematic diagram 1300 of a XDEC_SUB_REF circuit 228. The XDEC_SUB_REF circuit 228 performs the final equalization function for the reference voltage distribution path 234 to equalize the loading placed on the wordline voltage distribution path 232 by the 32,768 XDEC_SUB circuits. The XDEC_SUB_REF, circuit 228 has an input 1302 for the SBSR signal from the SBS_READ circuit 226 and output 1304, labeled REFWL, which is the equalized voltage for the reference array 230.

Figure 14:
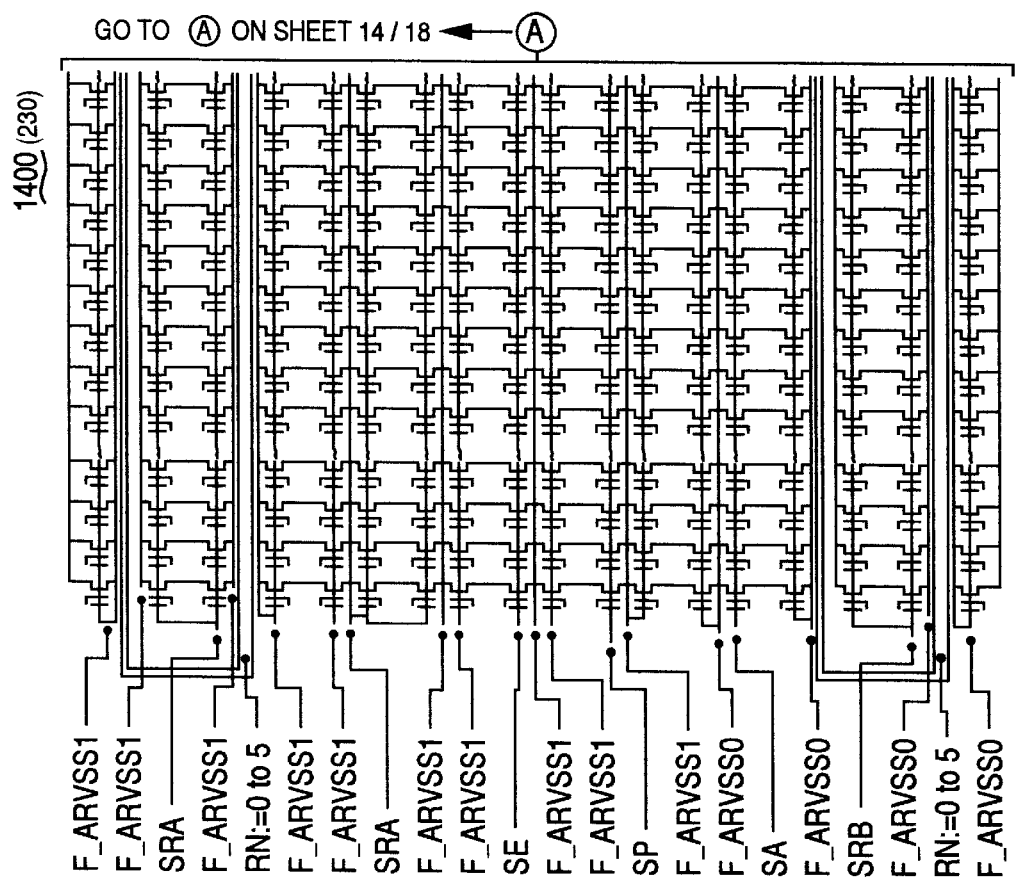
FIG. 14 depicts a schematic diagram of a reference array for use with the embodiment of FIG. 2.
Figure 14:
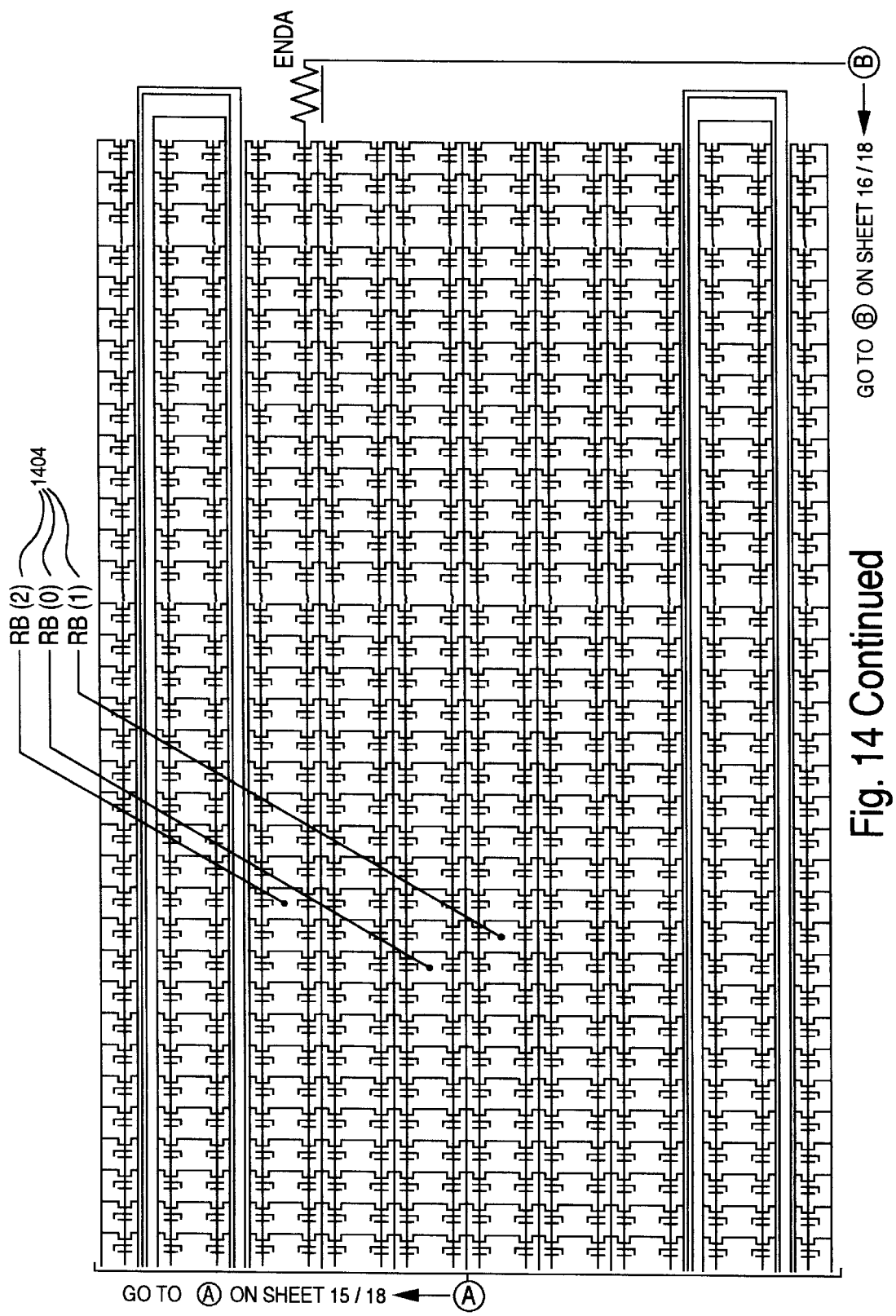
Figure 14:
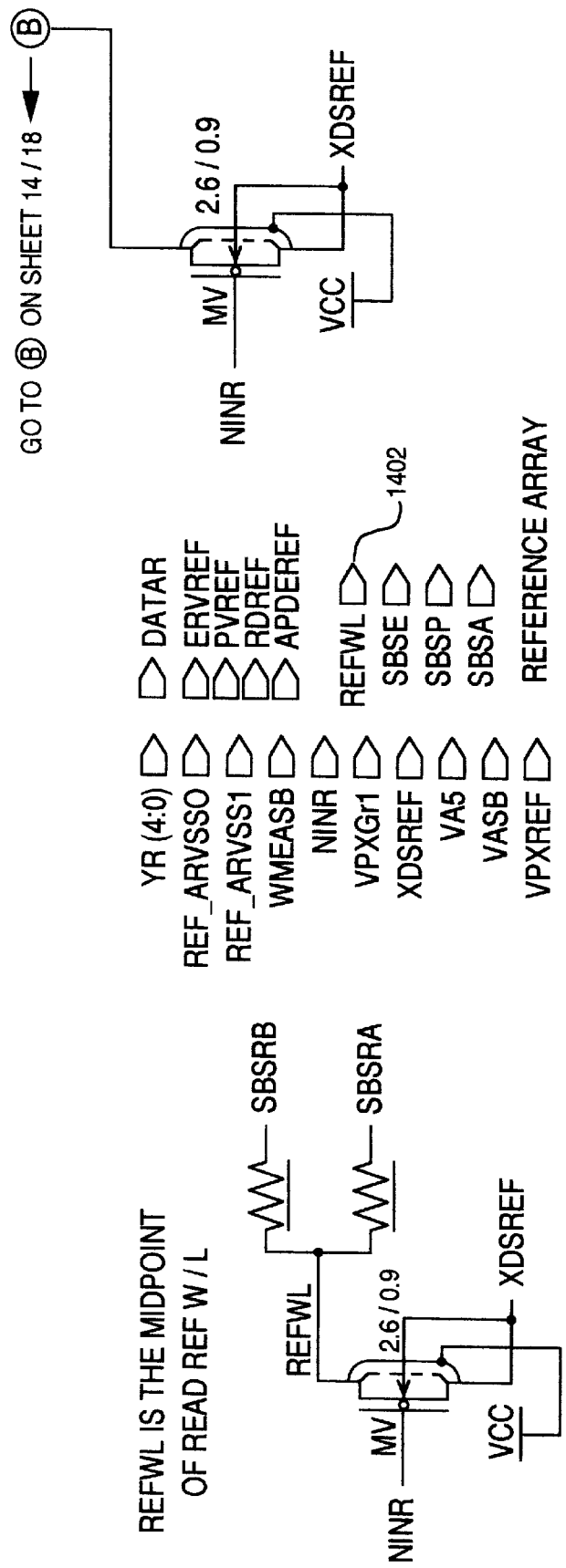

Referring now to FIG. 14, there is shown a schematic diagram 1400 of a reference array 230. The reference array 230 includes the reference flash memory cells 1404 which utilized by the differential sense amplifiers to distinguish the proper values when reading from the memory 128. There three reference cells 1404, labeled "RB(0)", "RB(1)", and "RB(2)". The reference array 230 has an input 1402 for the reference wordline voltage, REFWL provided by the XDEC_SUB_REF circuit 228. The reference wordline voltage path 232 is equalized so that the resistance and capacitance placed the reference wordline voltage, and therefore its delay, is substantially the same as that of the wordline voltage for the memory array 128. The outputs (not shown) of the reference array 230 go to the differential sense amplifiers of the read logic 124.

Figure 15:
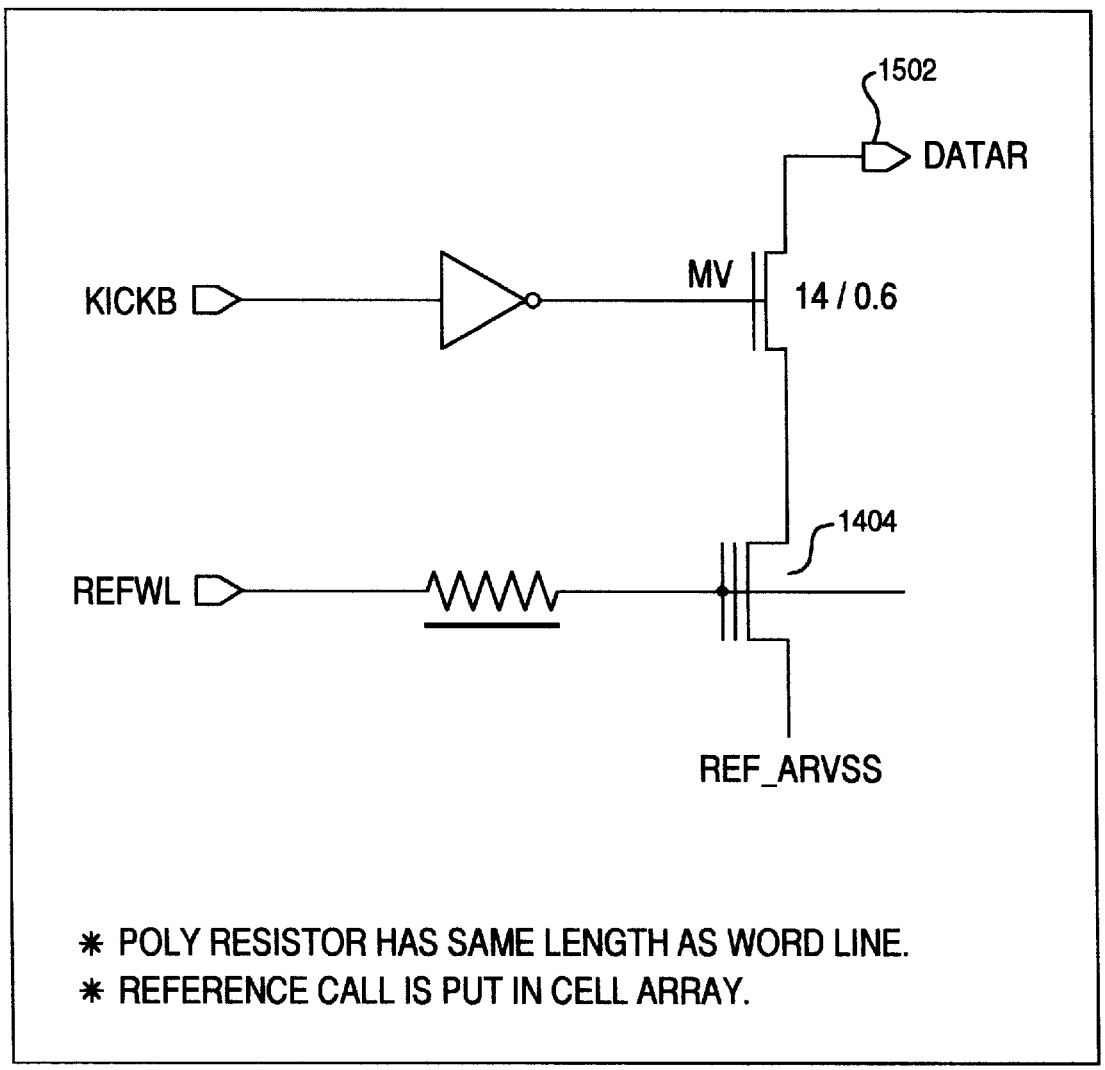
FIG. 15 depicts a schematic diagram of a single reference cell of the array depicted FIG. 14 for use with the embodiment of FIG. 2

For clarity, FIG. 15 shows a single reference cell 1404 from the reference array 230 and how the REFWL reference wordline voltage is coupled with the reference cell. The output 1502 of the reference cell, labeled "DATAR" is coupled with the differential sense amplifiers of the read logic 124.

In this way, the inputs of the differential sense amplifiers are guaranteed to have identical electrical characteristics. This ensures that only the difference in the stored data (i.e. the voltage stored in the memory cell) determines the output of the sense amplifier.

Note that it is preferable that the signal transmission speed of the reference voltage distribution path 232 as slow as the worst case wordline voltage distribution path 234. The timing of the reference voltage distribution path 232 is dependent on the KICKB signal which indicates when the Booster supply 104, 112 is boosting the wordlines. It is preferable that all of the wordline decoding be complete before the booster 104, 112 begins to boost the wordline.

There are a number of ways to implement the equalization circuits described above, including substitution of alternative circuit arrangements which include various combinations of capacitors, transistors and metal lines. Such alternatives may require variations in the fabrication process of the integrated circuit to achieve the desired result It will be appreciated by those skilled in the art that the equalization circuits required by the reference voltage path 232 depend on the implementation of the wordline voltage path 234 and that all methods of equalizing the electrical characteristics between the two, which account for varied implementations, are contemplated.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. A power distribution equalizer for a high density flash memory device, said device comprising a core array of single level flash memory cells, a wordline voltage distribution path coupled with said core array, a reference array and a reference voltage distribution path coupled with said reference array, said reference voltage distribution path and said wordline voltage distribution path each being characterized by first and second electrical properties, said equalizer comprising:

a path length equalization circuit coupled with said reference voltage distribution path and operative to equalize said first electrical property of said reference voltage distribution path to said first electrical property of said wordline voltage distribution path; and a loading equalization circuit coupled with said reference voltage distribution path and operative to equalize said second electrical property of said reference voltage distribution path to said second electrical property of said wordline voltage distribution path.

2. The power distribution equalizer of claim 1, wherein said first electrical property comprises resistance and said second electrical property comprises capacitance.

3. The power distribution equalizer of claim 1, wherein said wordline voltage distribution path is further characterized by a first path length and further wherein said path length equalization circuit comprises dummy metalization, said dummy metalization being characterized by a second path length substantially equivalent to said first path length.

4. The power distribution equalizer of claim 3, wherein said word line voltage distribution path is further characterized by a first path width and said dummy metalization is further characterized by a second path width, said second path width being substantially equivalent to ¼ of said first path width.

5. The power distribution equalizer of claim 4, wherein said wordline voltage distribution path is coupled with decoding logic, said decoding logic characterized by a first loading placed on said wordline voltage distribution path and further wherein said loading equalization circuit comprises dummy loading, said dummy loading characterized by a second loading substantially equivalent to ¼ of said first loading.

6. The power distribution equalizer of claim 4, wherein said second path length is approximately 8060 microns and said second path width is approximately 0.9 microns.

7. The power distribution equalizer of claim 1, wherein said wordline voltage distribution path is coupled with decoding logic, said decoding logic characterized by a first loading placed on said wordline voltage distribution path and further wherein said loading equalization circuit comprises dummy loading, said dummy loading characterized by a second loading substantially equivalent to said first loading.

8. A high density flash memory device comprising a core array of single level flash memory cells, said device further comprising:
- a wordline power supply operative to supply a voltage and a current;
- a wordline power distribution path coupled with said wordline power supply and said core array and operative to distribute said voltage and said current to said flash memory cells in said core array, said wordline power distribution path being characterized by a first electrical property;
- a reference array comprising one or more reference flash memory cells;
- a reference power distribution path coupled with said wordline power supply and said reference array and operative to distribute said voltage and said current to said reference flash memory cells in said reference array, said reference power distribution path being characterized by a second electrical property; and
- an equalization circuit coupled with said reference power distribution path and operative to substantially equalize said second electrical property to said first electrical property.

9. The high density flash memory device of claim 8, wherein said first electrical property comprises capacitance and resistance.

10. The high density flash memory device of claim 8, wherein said wordline power distribution path is further characterized by a first path length and further wherein said equalization circuit comprises dummy metalization, said dummy metalization being characterized by a second path length substantially equivalent to said first path length.

11. The high density flash memory device of claim 10, wherein said wordline power distribution path is further characterized by a first path width and said dummy metalization is further characterized by a second path width, said second path width being substantially equivalent to ¼ of said first path width.

12. The high density flash memory device of claim 11, wherein said wordline power distribution path is coupled with decoding logic, said decoding logic characterized by a first load placed on said wordline power distribution path and further wherein said equalization circuit comprises dummy loading, said dummy loading characterized by a second load substantially equivalent to ¼ of said first load.

13. The high density flash memory device of claim 11, wherein said second path length is approximately 8060 microns and said second path width is approximately 0.9 microns.

14. The high density flash memory device of claim 8, wherein said wordline power distribution path is coupled with decoding logic, said decoding logic characterized by a first load placed on said wordline power distribution path and further wherein said equalization circuit comprises dummy loading, said dummy loading characterized by a second load substantially equivalent to said first load.

15. A method of equalizing the wordline voltage and current distributed to a core cell over a wordline distribution path to the voltage and current distributed to a reference cell over a reference distribution path in a high density flash memory device, said method comprising:
- (a) determining a capacitance and resistance of said wordline distribution path;
- (b) determining a capacitance and resistance of said reference distribution path;
- (c) equalizing said capacitance and resistance of said reference distribution path to said capacitance and resistance of said wordline distribution path.

16. The method of claim 15, wherein (c) further comprises coupling dummy metalization with said reference distribution path.

17. The method of claim 16, wherein said dummy metalization is characterized by a length of approximately 8060 microns.

18. The method of claim 15, wherein (c) further comprises coupling dummy loading with said reference distribution path.

19. The method of claim 18, wherein said dummy loading comprises dummy transistors.

* * * * *